US008791773B2

(12) United States Patent
Tanaka

(10) Patent No.: US 8,791,773 B2
(45) Date of Patent: Jul. 29, 2014

(54) SURFACE ACOUSTIC WAVE FILTER AND DUPLEXER

(75) Inventor: Hiroyuki Tanaka, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 496 days.

(21) Appl. No.: 13/131,837

(22) PCT Filed: Nov. 27, 2009

(86) PCT No.: PCT/JP2009/070055
§ 371 (c)(1),
(2), (4) Date: Jun. 3, 2011

(87) PCT Pub. No.: WO2010/061925
PCT Pub. Date: Jun. 3, 2010

(65) Prior Publication Data
US 2011/0227668 A1    Sep. 22, 2011

(30) Foreign Application Priority Data

Nov. 28, 2008  (JP) ................................. 2008-305731

(51) Int. Cl.
| H03H 9/72 | (2006.01) |
| H03H 9/64 | (2006.01) |
| H03H 9/00 | (2006.01) |
| H03H 9/02 | (2006.01) |
| H03H 9/145 | (2006.01) |

(52) U.S. Cl.
CPC ........... *H03H 9/0057* (2013.01); *H03H 9/0085* (2013.01); *H03H 9/725* (2013.01); *H03H 9/02952* (2013.01); *H03H 9/6469* (2013.01); *H03H 9/6489* (2013.01); *H03H 9/14579* (2013.01)

USPC ............................ 333/133; 333/195; 333/193

(58) Field of Classification Search
USPC ........... 333/133, 193–196; 310/313 B, 313 D
See application file for complete search history.

(56) References Cited

U.S. PATENT DOCUMENTS 6,753,641 B2 *  6/2004  Takamine ................ 310/313 B
6,963,156 B2 * 11/2005  Shibahara et al. ........ 310/313 D (Continued)

FOREIGN PATENT DOCUMENTS

JP        03127505 A    5/1991
JP        07283681 A    10/1995

(Continued)

OTHER PUBLICATIONS

International preliminary report on patentability dated Jul. 14, 2011 and its English language translation for corresponding PCT application PCT/JP2009/070055.

(Continued)

Primary Examiner — Barbara Summons
(74) Attorney, Agent, or Firm — DLA Piper LLP (US)

(57) ABSTRACT

A surface acoustic wave filter and a duplexer are provided. In a surface acoustic wave filter, on a piezoelectric substrate, a first IDT electrode composed of an input/output electrode and a first floating electrode, and a second IDT electrode composed of a ground electrode and a second floating electrode are arranged, and are connected in series to each other via the first floating electrode and the second floating electrode to form IDTs. In two serial IDTs arranged next to each other, an electrode finger of the input/output electrode in the first IDT electrode of one serial IDT is arranged next to an electrode finger of the ground electrode in the second IDT electrode of the other serial IDT.

8 Claims, 9 Drawing Sheets

(56) References Cited

U.S. PATENT DOCUMENTS

| | | |
|---|---|---|
| 2006/0044079 A1 | 3/2006 | Nishizawa et al. |
| 2006/0208834 A1 | 9/2006 | Takamine |
| 2006/0244550 A1 | 11/2006 | Inoue et al. |
| 2008/0246552 A1 | 10/2008 | Shibahara et al. |
| 2009/0002097 A1 | 1/2009 | Takamine |

FOREIGN PATENT DOCUMENTS

| | | |
|---|---|---|
| JP | 2003023341 A | 1/2003 |
| JP | 2006074202 A | 3/2006 |
| JP | 2006311180 A | 11/2006 |
| JP | 2007019976 A | 1/2007 |
| WO | 2006022143 A1 | 3/2006 |
| WO | 2006067884 A1 | 6/2006 |
| WO | 2007116760 A1 | 10/2007 |

OTHER PUBLICATIONS

International search report dated Jan. 19, 2010 for corresponding PCT application PCT/JP2009/070055 cites the foreign patent documents above.

Japanese language office action dated Aug. 21, 2012 and its English language translation issued in corresponding Japanese application 2010540530 cites the foreign patent documents above.

* cited by examiner

SURFACE ACOUSTIC WAVE FILTER AND DUPLEXER

CROSS-REFERENCE TO THE RELATED APPLICATIONS

The present application is a national stage of international application No. PCT/JP2009/070055, filed on Nov. 27, 2009, and claims the benefit of priority under 35 USC 119 to Japanese Patent Application No. 2008-305731, filed on Nov. 28, 2008, the entire contents of which are incorporated herein by reference.

TECHNICAL FIELD

The present invention relates to a surface acoustic wave filter having series-connected interdigital transducers (IDT for short), and a duplexer having the surface acoustic wave filter.

BACKGROUND ART

A surface acoustic wave (SAW for short) is a wave which propagates with energy concentration around the surface of an elastic body, and a filter element utilizing this wave is called "surface acoustic wave filter".

In a case of a duplexer using a surface acoustic wave filter, for example, a transmitted signal passing through a transmission filter is basically directed to an antenna, but part of the signal can become leakage power that finds its way into a reception filter, which results in filter damage. Such a filter damage problem tends to be more serious especially in a multiple-mode type surface acoustic wave filter.

A surface acoustic wave filter disclosed in Patent Literature 1 comprises a plurality of IDT groups, each of which is composed of a plurality of IDTs connected in series to each other, with a floating electrode interposed between an input/output electrode and a ground electrode. In the IDTs that are arranged next to each other, out of adjacent electrode fingers of, respectively, one IDT and the other, one electrode finger is connected to the floating electrode and the other electrode finger is connected to one of the input/output electrode and the ground electrode. In this construction, the power handling capability of the surface acoustic wave filter acting as a multiple-mode type surface acoustic wave filter can be enhanced, thereby suppressing filter damage.

However, in the structure of the surface acoustic wave filter disclosed in Patent Literature 1, due to capacitive coupling in the adjacent part between the electrode finger connected to the floating electrode and the electrode finger connected to the input/output electrode, leakage of electric current is developed between the adjacent IDTs. As a result, the surface acoustic wave filter disclosed in Patent Literature 1 poses the problem of inadequate attenuation in a region outside the passband.

An object of the invention is to provide a multiple-mode type surface acoustic wave filter and a duplexer that suffer less deterioration in out-of-passband attenuation and are excellent in power handling capability.

Patent Literature 1: Japanese Unexamined Patent Publication JP-A 2006-311180

SUMMARY OF INVENTION

In a first aspect of the invention, a surface acoustic wave filter comprises a plurality of series-connected type IDT electrodes each comprising a first IDT electrode composed of an input/output electrode having a plurality of first electrode fingers and a first floating electrode which has a plurality of second electrode fingers and is disposed in an electrically floating state, and a second IDT electrode composed of a ground electrode having a plurality of third electrode fingers and a second floating electrode which has a plurality of fourth electrode fingers, is connected to the first floating electrode, and is disposed in an electrically floating state.

The plurality of series-connected type IDT electrodes include a first series-connected type IDT electrode and a second series-connected type IDT electrode which is adjacent to the first series-connected type IDT electrode.

The first IDT electrode of the first series-connected type IDT electrode and the second IDT electrode of the second series-connected type IDT electrode are arranged next to each other. At least one of the plurality of first electrode fingers of the first series-connected type IDT electrode is placed facing the second series-connected type IDT electrode, and at least one of the plurality of third electrode fingers of the second series-connected type IDT electrode is placed facing the first series-connected type IDT electrode.

In a second aspect of the invention, a duplexer comprises the surface acoustic wave filter set forth hereinabove.

ADVANTAGEOUS EFFECTS OF INVENTION

According to the surface acoustic wave filter of the first aspect of the invention, the electrode finger of the input/output electrode is adjacent to the electrode finger of the ground electrode. In this construction, an electric current, which has flowed from one series-connected type IDT electrode to the other adjacent series-connected type IDT electrode due to capacitive coupling between the adjacent electrode fingers of the input/output electrode and the ground electrode, respectively, in the series-connected type IDT electrodes arranged next to each other, flows to the ground electrode and thus can hardly flow to an output terminal. This makes it possible to suppress occurrence of leakage of electric current between the adjacent series-connected type IDT electrodes. As a result, deterioration in attenuation in a region outside the passband resulting from a leakage current can be suppressed, wherefore enhancement in bandpass characteristics can be achieved.

Moreover, according to the duplexer of the second aspect of the invention, the duplexer is constructed of the filter having excellent bandpass characteristics and is therefore excellent in electric characteristics.

BRIEF DESCRIPTION OF DRAWINGS

Other and further objects, features, and advantages of the invention will be more explicit from the following detailed description taken with reference to the drawings wherein.

DESCRIPTION OF EMBODIMENTS

Hereinafter, preferred embodiments of the invention will be described in detail with reference to the drawings.

Figure 1:
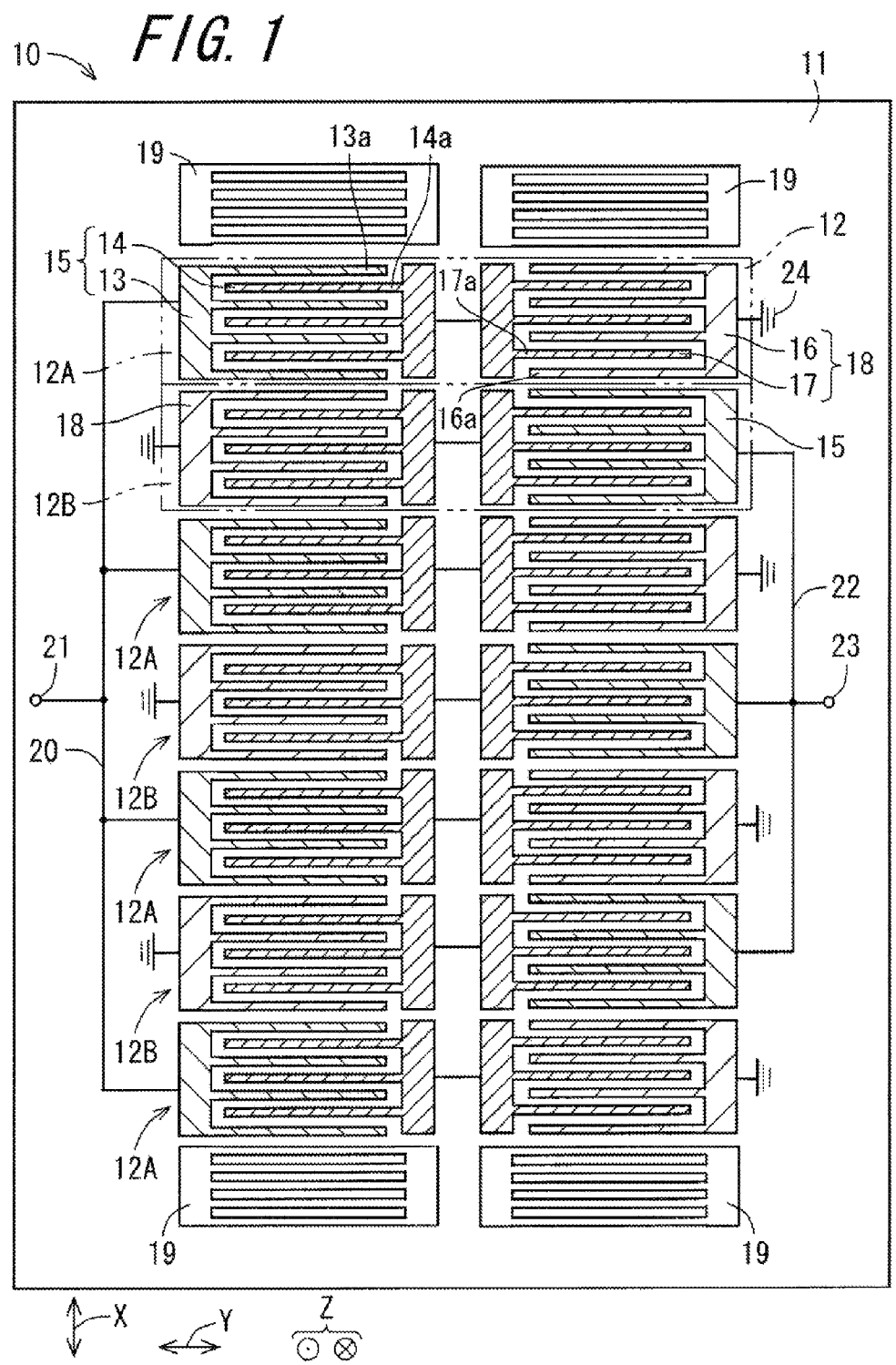
FIG. 1 is a plan view showing a surface acoustic wave filter 10 in accordance with a first embodiment of the invention.

FIG. 1 is a plan view showing a surface acoustic wave filter 10 in accordance with a first embodiment of the invention. The surface acoustic wave filter 10 comprises a piezoelectric substrate 11 and a series-connected type IDT electrode 12 (hereafter also referred to simply as "serial IDT").

The piezoelectric substrate 11 is quadrilateral in shape as projected on an imaginary plane perpendicular to the direction of thickness of the piezoelectric substrate 11, and is rectangular in this embodiment. In the following embodiments, the directions of length, width, and thickness of the piezoelectric substrate 11 will be defined as a longitudinal direction X, a widthwise direction Y, and a thicknesswise direction Z, respectively. The longitudinal direction X, the widthwise direction Y, and the thicknesswise direction Z intersect at right angles to constitute a three-dimensional orthogonal coordinate system. In FIG. 1, the longitudinal direction, the widthwise direction, and the thicknesswise direction of the piezoelectric substrate 11 are indicated by symbols X, Y, and Z, respectively.

A plurality of serial IDTs 12 are formed on one main surface of the piezoelectric substrate 11 in the Z direction. The serial IDTs 12 are arranged next to each other along the longitudinal direction X. A surface acoustic wave (SAW) propagates in a direction parallel to the arrangement of the serial IDTs 12, namely, the longitudinal direction X.

The serial IDT 12 is constructed of a first IDT electrode 15 composed of an input/output electrode 13 and a first floating electrode 14 and a second IDT electrode 18 composed of a ground electrode 16 and a second floating electrode 17, the first IDT electrode 15 and the second IDT electrode 18 being connected in series to each other via the first floating electrode 14 and the second floating electrode 17.

The input/output electrode 13 is a comb-shaped electrode formed of a strip-like first common electrode and a plurality of first electrode fingers 13a extending perpendicularly to the first common electrode (hereafter also referred to simply as "electrode fingers 13a"). The first floating electrode 14 is a comb-shaped electrode formed of a strip-like second common electrode and a plurality of second electrode fingers 14a extending perpendicularly to the second common electrode (hereafter also referred to simply as "electrode fingers 14a"). The input/output electrode 13 and the first floating electrode 14 are arranged facing each other in such a manner that the first common electrode and the second common electrode become parallel and that, within the region of confrontation between the common electrodes, the electrode fingers 13a and the electrode fingers 14a are alternately arranged in an interdigital fashion in the direction of SAW propagation.

Likewise, the ground electrode 16 is a comb-shaped electrode formed of a strip-like third common electrode and a plurality of third electrode fingers 16a extending perpendicularly to the third common electrode (hereafter also referred to simply as "electrode fingers 16a"). The second floating electrode 17 is a comb-shaped electrode formed of a strip-like fourth common electrode and a plurality of fourth electrode fingers 17a extending perpendicularly to the fourth common electrode (hereafter also referred to simply as "electrode fingers 16a"). The ground electrode 16 and the second floating electrode 17 are arranged facing each other in such a manner that the third common electrode and the fourth common electrode become parallel and that, within the region of confrontation between the common electrodes, the electrode fingers 16a and the electrode fingers 17a are alternately arranged in an interdigital fashion in the direction of SAW propagation.

In the first IDT electrode 15, the number of the electrode fingers 13a of the input/output electrode 13 is larger by one than the number of the electrode fingers 14a of the first floating electrode 14, and the electrode finger at each of the opposite ends of the first IDT electrode 15 corresponds to the electrode finger 13a of the input/output electrode 13. In FIG. 1, the input/output electrode 13 has four electrode fingers 13a and the first floating electrode 14 has three electrode fingers 14a, and the three electrode fingers 14a are each placed between adjacent ones of the four electrode fingers 13a. However, the numbers of the electrode fingers 13a and 14a are not particularly limited and can therefore be determined arbitrarily in accordance with the size of the surface acoustic wave filter 10, the wavelength of SAW, and so forth.

In the second IDT electrode 18, the number of the electrode fingers 16a of the ground electrode 16 is larger by one than the number of the electrode fingers 17a of the second floating electrode 17, and the electrode finger at each of the opposite ends of the second IDT electrode 18 corresponds to the electrode finger 16a of the ground electrode 16. In FIG. 1, the ground electrode 16 has four electrode fingers 16a and the second floating electrode 17 has three electrode fingers 17a, and the three electrode fingers 17a are each placed between adjacent ones of the four electrode fingers 16a. However, the numbers of the electrode fingers 16a and 17a are not particularly limited and can therefore be determined arbitrarily in accordance with the size of the surface acoustic wave filter 10, the wavelength of SAW, and so forth.

Among a plurality of serial IDTs 12, out of the serial IDTs 12 arranged next to each other, one will referred to as "the first serial IDT 12A" (hereafter also referred to simply as "serial IDT 12A"), and the other will be referred to as "the second serial IDT 12B" (hereafter also referred to simply as "serial IDT 12B").

As has already been described, the first IDT electrode 15 is so configured that the electrode finger at each end thereof in the SAW propagation direction corresponds to the electrode finger 13a of the input/output electrode 13, and the second IDT electrode 18 is so configured that the electrode finger at each end thereof in the SAW propagation direction corresponds to the electrode finger 16a of the ground electrode 16. That is, one electrode finger 13a of the input/output electrode 13 in the first IDT electrode 15 constituting the serial IDT 12A is disposed facing the serial IDT 12B, and one electrode finger 16a of the ground electrode 16 in the second IDT electrode 18 constituting the serial IDT 12B is disposed facing the serial IDT 12A. Accordingly, in the serial IDT 12A and the serial IDT 12B arranged next to each other, the electrode finger 13a of the input/output electrode 13 is adjacent to the electrode finger 16a of the ground electrode 16.

The serial IDTs 12A and the serial IDTs 12B which have an inverse relationship therebetween in terms of electrode arrangement are arranged in alternate order in the longitudinal direction X which is also the direction of SAW propagation, and reflectors 19 are disposed on both sides of an array of the serial IDTs in this direction. A surface acoustic wave excited for propagation by the serial IDT 12A and the serial IDT 12B is reflected from the reflector 19, thereby producing a standing wave.

The connection between a plurality of serial IDTs 12A of the same electrode arrangement is established by connecting the input/output electrodes 13 of the first IDT electrodes 15 thereof together via a wiring line 20. The wiring line 20 is connected to a first unbalance terminal 21. As with the serial IDTs 12A, the connection between a plurality of serial IDTs 12B is established by connecting the input/output electrodes 13 of the first IDT electrodes 15 thereof together via a wiring line 22. The wiring line 22 is connected to a second unbalance terminal 23.

In the plurality of serial IDTs 12A, the ground electrodes 16 of the second IDT electrodes 18 are each connected to ground via a ground terminal or the like. Also, in a plurality of serial IDTs 12B, the ground electrodes 16 of the second IDT electrodes 18 are each connected to ground via a ground terminal or the like.

In this embodiment, the first unbalance terminal 21 serves as an input terminal for receiving input of an unbalanced signal, and the second unbalance terminal 23 serves as an output terminal for producing output of an unbalanced signal. It is noted that the first unbalance terminal is one aspect of "the first external terminal" of the invention, and the second unbalance terminal is one aspect of "the second external terminal" of the invention.

Figure 2:
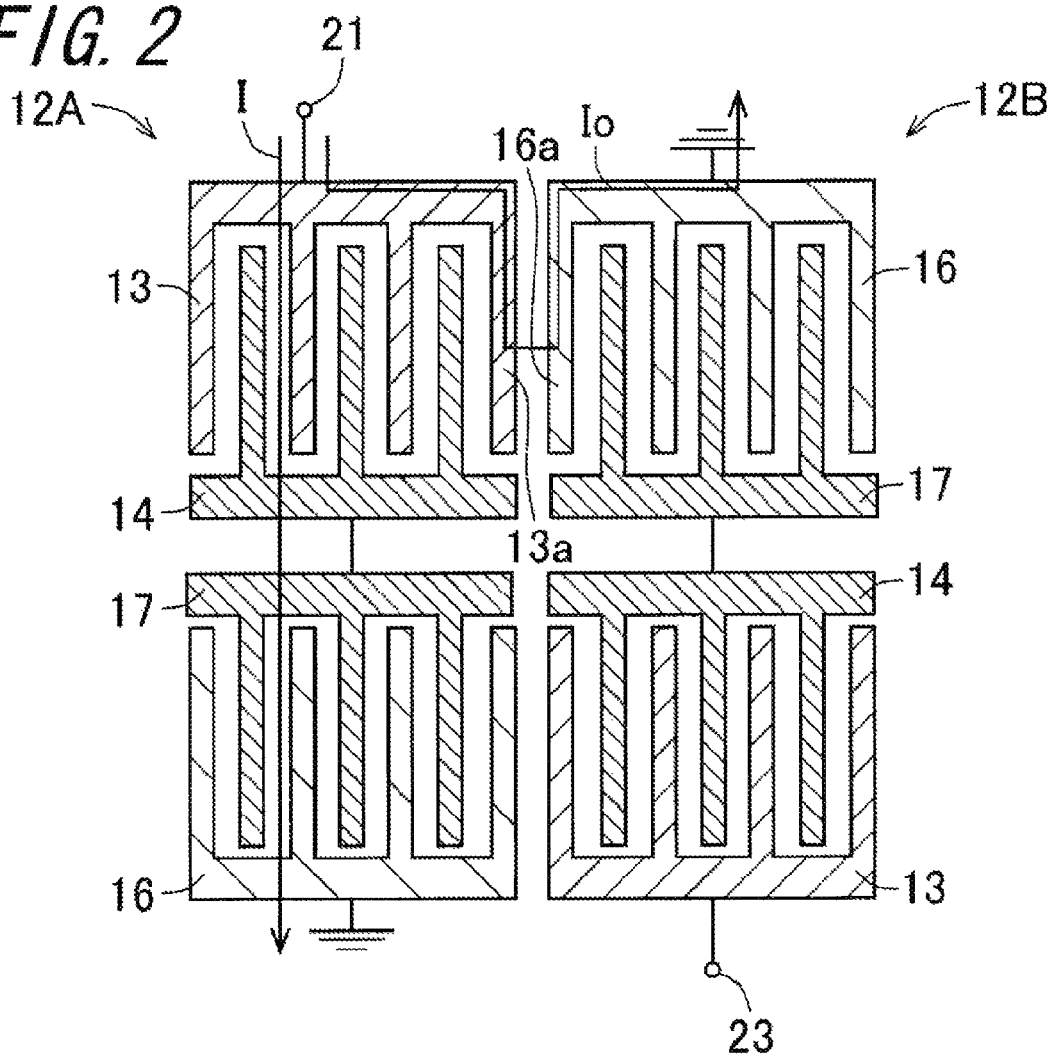
FIG. 2 is a schematic diagram showing how electric current flows through a serial IDT 12A and a serial IDT 12B at the time of signal input.

FIG. 2 is a schematic diagram showing how electric current flows through the serial IDT 12A and the serial IDT 12B at the time of signal input.

Upon the input of a signal to the first unbalance terminal 21, in the serial IDT 12A, a main current I flows from the input/output electrode 13 to the ground electrode 16 through the first floating electrode 14 and the second floating electrode 17. At this time, since the input/output electrode 13 of the serial IDT 12A and the ground electrode 16 of the serial IDT 12B are arranged next to each other, it follows that a capacitive coupling occurs between the electrode finger 13a of the input/output electrode 13 and the electrode finger 16a of the ground electrode 16. A current Io, which has flowed from the serial IDT 12A to the adjacent serial IDT 12B in the presence of the capacitive coupling, flows to the ground electrode 16 of the serial IDT 12B and thus can hardly flow to the second unbalance terminal 23 serving as an output terminal. This makes it possible to suppress occurrence of leakage of electric current between the adjacent serial IDTs, and thereby suppress deterioration in attenuation in a region outside the passband resulting from the leakage current.

Although the dimensions and other requirements of the input/output electrode 13, the first floating electrode 14, the ground electrode 16, and the second floating electrode 17 may be determined arbitrarily in accordance with the size of the surface acoustic wave filter 10, the wavelength of SAW, and so forth, it is preferable that the dimension of each gap between the adjacent serial IDTs 12, as well as the wiring pitch of each electrode finger 13a of the input/output electrode 13 and each electrode finger 14a of the first floating electrode 14 and the wiring pitch of each electrode finger 16a of the ground electrode 16 and each electrode finger 17a of the second floating electrode 17, is identical. This makes it possible to achieve enhancement in power handling capability.

Figure 8:
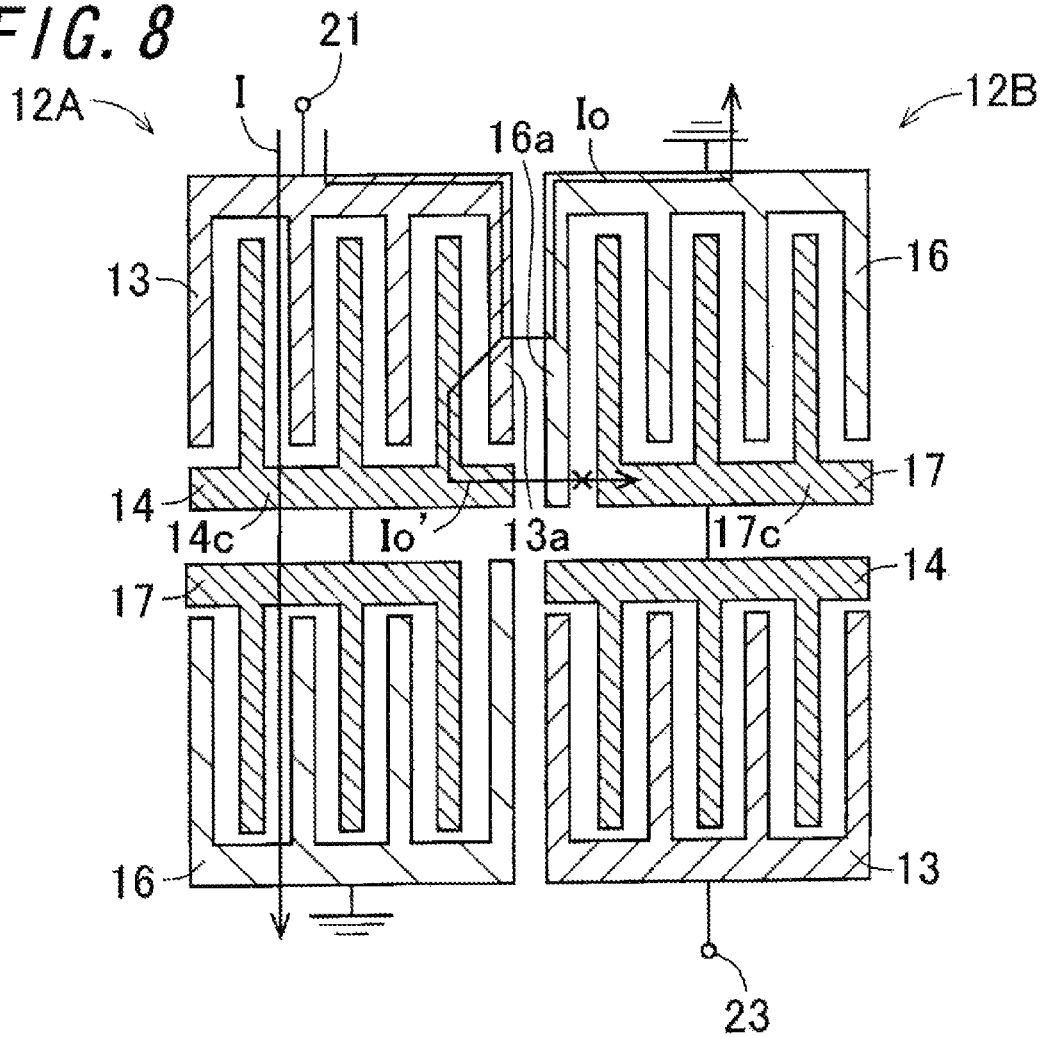
FIG. 8 is a plan view showing a serial IDT 12A and a serial IDT 12B in a surface acoustic wave filter in accordance with a modified example of the first embodiment of the invention.

FIG. 8 is a plan view showing a modified example of the surface acoustic wave filter 10 according to the first embodiment. In FIG. 8, there is shown only part of the filter corresponding to a serial IDT 12A and a serial IDT 12B.

The surface acoustic wave filter 10 according to a modified example as shown in FIG. 8 differs from the surface acoustic wave filter 10 shown in FIG. 1 in the configuration of an electrode finger 16a of the ground electrode 16 in the serial IDT 12B. Specifically, the electrode finger 16a of the ground electrode 16 in the serial IDT 12B, which is disposed facing the serial IDT 12A, is located between the common electrode 14c (the second common electrode) of the first floating electrode 14 in the serial IDT 12A and the common electrode 17c (the fourth common electrode) of the second floating electrode 17 in the serial IDT 12B.

As has already been described, upon the input of a signal to the first unbalance terminal 21, the flow of a current Io takes place because of the capacitive coupling between the electrode finger 13a of the input/output electrode 13 and the electrode finger 16a of the ground electrode 16. However, at this time, there may be a case where, in addition to the flow of the current Io, the flow of a current Io' takes place because of the capacitive coupling between the electrode finger 13a of the input/output electrode 13 and the electrode finger 14a of the first floating electrode 14. The current Io' can possibly flow further toward the second floating electrode 17 of the serial IDT 12B because of the capacitive coupling between the common electrode 14c of the first floating electrode 14 and the adjacent common electrode 17c of the second floating electrode 17. In this respect, as in the modified example shown in FIG. 8, by placing the electrode finger 16a of the ground electrode 16 of the serial IDT 12B disposed facing the serial IDT 12A so as to lie between the common electrode 14c of the first floating electrode 14 in the serial IDT 12A and the common electrode 17c of the second floating electrode 17 in the serial IDT 12B, the current Io' which can possibly flow from the common electrode 14c to the common electrode 17c can be cut off substantially completely by the electrode finger 16a. This makes it possible to suppress occurrence of leakage of electric current between the adjacent serial IDTs, and thereby suppress deterioration in out-of-passband attenuation resulting from the leakage current.

Figure 9:
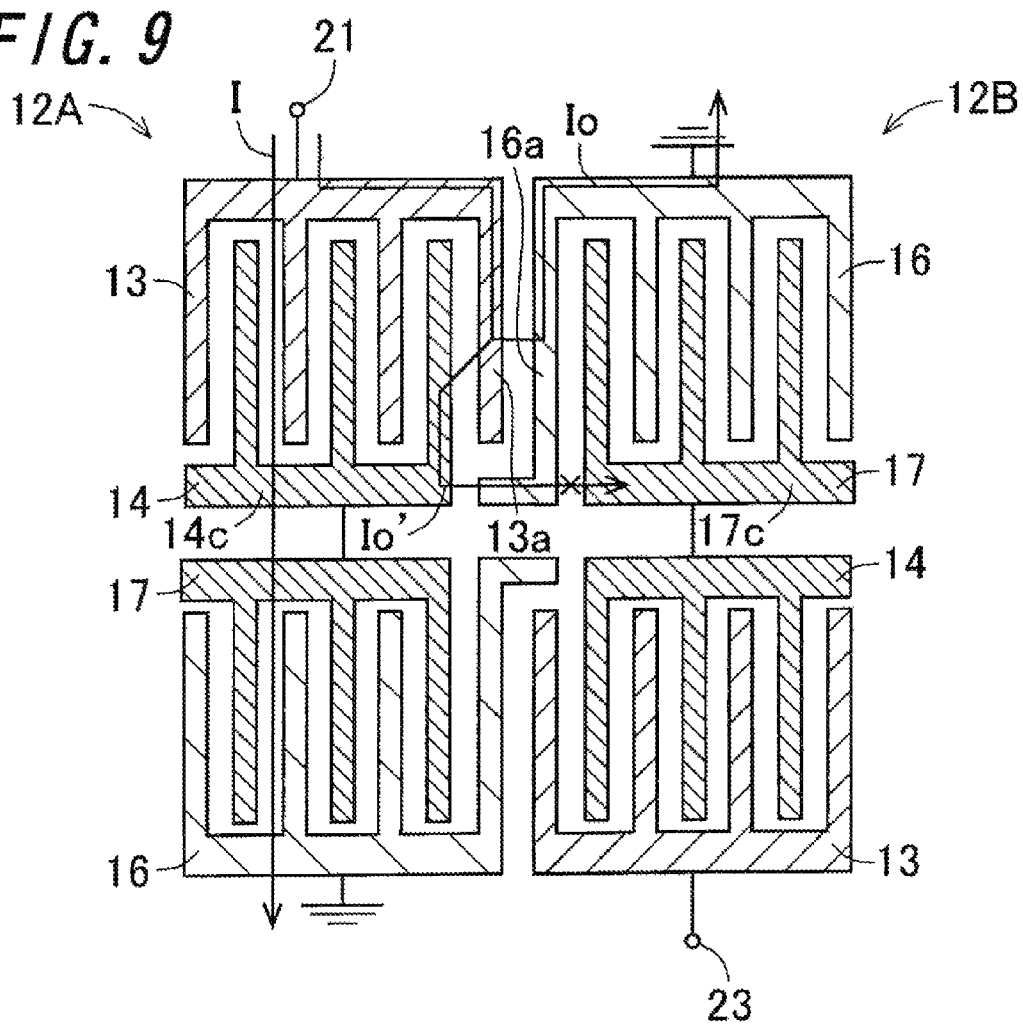
FIG. 9 is a plan view showing a serial IDT 12A and a serial IDT 12B in a surface acoustic wave filter in accordance with another modified example of the first embodiment of the invention.

FIG. 9 is a plan view showing another modified example of the surface acoustic wave filter 10 according to the first embodiment. In FIG. 9, there is shown only part of the filter corresponding to a serial IDT 12A and a serial IDT 12B.

The surface acoustic wave filter 10 according to another modified example as shown in FIG. 9 is identical with the modified example shown in FIG. 8 in that the electrode finger 16a of the ground electrode 16 of the serial IDT 12B disposed facing the serial IDT 12A is located between the common electrode 14c of the first floating electrode 14 in the serial IDT 12A and the common electrode 17c of the second floating electrode 17 in the serial IDT 12B, but differs therefrom in the configuration of the common electrode 14c and in the configuration of the electrode finger 16a lying between the common electrode 14c and the common electrode 17c. Specifically, in the surface acoustic wave filter as shown in FIG. 2 or FIG. 8, an end of the common electrode 14c on a side close to the common electrode 17c is located near the boundary region between the serial IDT 12A and the serial IDT 12B. On the other hand, in the surface acoustic wave filter 10 of the modified example as shown in FIG. 9, an end of the common electrode 14c on a side close to the common electrode 17c is located away from the boundary region between the serial IDT 12A and the serial IDT 12B.

In this way, the distance between the common electrode 14c and the common electrode 17c can be increased, thereby enhancing the effect of cutting off the current Io' which can possibly flow from the common electrode 14c to the common electrode 17c. This makes it possible to suppress occurrence of leakage of electric current between the adjacent serial IDTs more reliably, and thereby suppress deterioration in out-of-passband attenuation resulting from the leakage current more reliably.

Moreover, when the end of the common electrode 14c on the side close to the common electrode 17c is located away from the boundary region between the serial IDT 12A and the serial IDT 12B, then a space is created between the common electrode 14c and the common electrode 17c. It is preferable that the electrode finger 16a is so shaped as to fill this space therewith. In the presence of the space between the common electrode 14c and the common electrode 17c, a bulk wave tends to develop, which leads to deterioration in loss characteristics. In this respect, by placing the electrode finger 16a in the space, it is possible to suppress the development of a bulk wave while enhancing the effect of cutting off the current Io' which can possibly flow from the common electrode 14c to the common electrode 17c even further.

Figure 3:
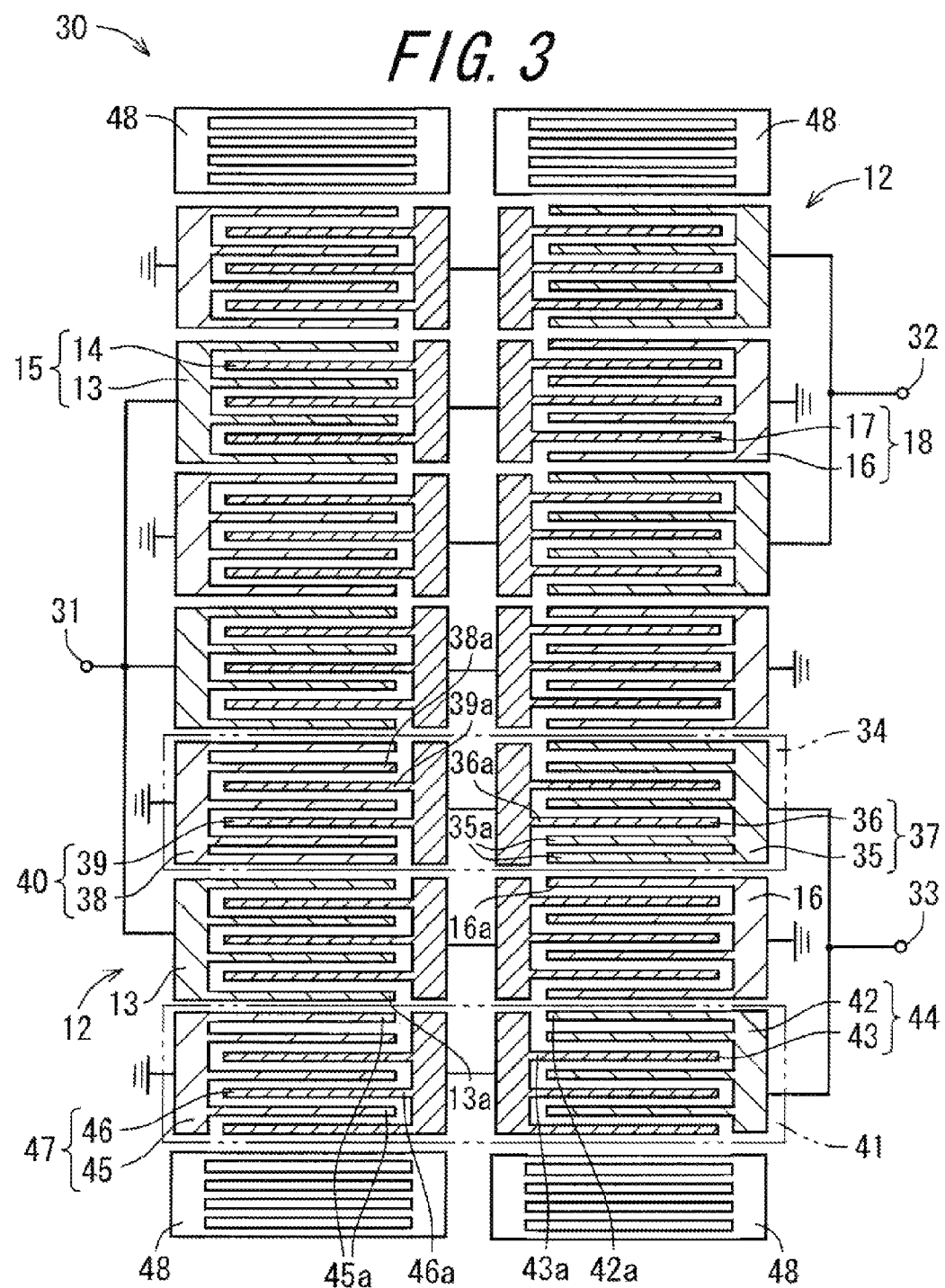
FIG. 3 is a plan view showing a surface acoustic wave filter 30 in accordance with a second embodiment of the invention.

FIG. 3 is a plan view showing a surface acoustic wave filter 30 in accordance with a second embodiment of the invention. The surface acoustic wave filter 10 according to the first embodiment is of a so-called unbalance input-unbalance output type which is designed for input of unbalanced signals and output of unbalanced signals. By contrast, the surface acoustic wave filter 30 according to the second embodiment is of an unbalance input-balance output type which is designed for input of unbalanced signals and output of balanced signals.

A signal inputted via an unbalance terminal 31 serving as an input terminal is outputted from a first balance terminal 32, as well as a second balance terminal 33, serving as an output terminal. It is noted that the unbalance terminal 31 is one aspect of "the fourth external terminal" of the invention, and the first balance terminal 32 and the second balance terminal 33 are each one aspect of "the third external terminal" of the invention. At this time, the signal outputted from the first balance terminal 32 and the signal outputted from the second balance terminal 33 are in phase opposition; that is, the signals are outputted as differential signals. In this embodiment, the signal outputted from the first balance terminal 32 is in phase with the input signal, and the signal outputted from the second balance terminal 33 is opposite in phase to the signal outputted from the first balance terminal 32.

Therefore, a serial IDT 12 connected to the unbalance terminal 31 serving as an input terminal, as well as a serial IDT 12 connected to the first balance terminal 32 for producing an output signal which is in phase with the input signal, has the same configuration as that of the serial IDT 12 according to the first embodiment. Moreover, a serial IDT 34 and a serial IDT 41 connected to the second balance terminal 33 differ in configuration from the serial IDT 12.

The serial IDT 34 is constructed of a first IDT electrode 37 composed of an input/output electrode 35 and a first floating electrode 36 and a second IDT electrode 40 composed of a ground electrode 38 and a second floating electrode 39. The first IDT electrode 37 and the second IDT electrode 40 are connected in series to each other via the first floating electrode 36 and the second floating electrode 39.

The input/output electrode 35 and the first floating electrode 36, each of which is a comb-shaped electrode formed of a strip-like common electrode and a plurality of electrode fingers extending perpendicularly to the common electrode, are arranged facing each other in such a manner that their common electrodes become parallel and that, within the region of confrontation between the common electrodes, the electrode fingers of the comb-shaped electrodes are alternately arranged in an interdigital fashion in the direction of SAW propagation.

Likewise, the ground electrode 38 and the second floating electrode 39, each of which is a comb-shaped electrode formed of a strip-like common electrode and a plurality of electrode fingers extending perpendicularly to the common electrode, are arranged facing each other in such a manner that their common electrodes become parallel and that, within the region of confrontation between the common electrodes, the electrode fingers of the comb-shaped electrodes are alternately arranged in an interdigital fashion in the direction of SAW propagation.

In the first IDT electrode 37, the number of the electrode fingers 35a of the input/output electrode 35 is larger by three than the number of the electrode fingers 36a of the first floating electrode 36, and the electrode finger at each of the opposite ends of the first IDT electrode 37 corresponds to two electrode fingers 35a of the input/output electrode 35. In FIG. 3, there are five electrode fingers 35a in total, and two of them are situated at one end, another two of them are situated at the other end, and the remaining one is situated centrally. Two electrode fingers 36a of the first floating electrode 36 are so arranged that the central electrode finger 35a is interposed therebetween. It is noted that the numbers of the electrode fingers 35a and 36a are not particularly limited and can therefore be determined arbitrarily, so long as two electrode fingers 35a are arranged at each end, in accordance with the size of the surface acoustic wave filter 30, the wavelength of SAW, and so forth.

In the second IDT electrode 40, the number of the electrode fingers 38a of the ground electrode 38 is larger by three than the number of the electrode fingers 39a of the second floating electrode 39, and the electrode finger at each of the opposite ends of the second IDT electrode 40 corresponds to two electrode fingers 38a of the ground electrode 38. In FIG. 3, there are five electrode fingers 38a in total, and two of them are situated at one end, another two of them are situated at the other end, and the remaining one is situated centrally. Two electrode fingers 39a of the second floating electrode 39 are so arranged that the central electrode finger 38a is interposed therebetween. It is noted that the numbers of the electrode fingers 38a and 39a are not particularly limited and can therefore be determined arbitrarily, so long as two electrode fingers 38a are arranged at each end, in accordance with the size of the surface acoustic wave filter 30, the wavelength of SAW, and so forth.

The serial IDT 41 is constructed of a first IDT electrode 44 composed of an input/output electrode 42 and a first floating electrode 43 and a second IDT electrode 47 composed of a ground electrode 45 and a second floating electrode 46, the first IDT electrode 44 and the second IDT electrode 47 being connected in series to each other via the first floating electrode 43 and the second floating electrode 46.

The input/output electrode 42 and the first floating electrode 43, each of which is a comb-shaped electrode formed of a strip-like common electrode and a plurality of electrode fingers extending perpendicularly to the common electrode, are arranged facing each other in such a manner that their common electrodes become parallel and that, within the region of confrontation between the common electrodes, the electrode fingers of the comb-shaped electrodes are alternately arranged in an interdigital fashion in the direction of SAW propagation.

Likewise, the ground electrode 45 and the second floating electrode 46, each of which is a comb-shaped electrode formed of a strip-like common electrode and a plurality of electrode fingers extending perpendicularly to the common electrode, are arranged facing each other in such a manner that their common electrodes become parallel and that, within the region of confrontation between the common electrodes, the electrode fingers of the comb-shaped electrodes are alternately arranged in an interdigital fashion in the direction of SAW propagation.

In the first IDT electrode 44, the number of the electrode fingers 42a of the input/output electrode 42 is larger by one than the number of the electrode fingers 43a of the first floating electrode 43. Two electrode fingers 42a of the input/output electrode 42 are arranged at one end of the first IDT electrode 44, and one electrode finger 43a of the first floating electrode 43 is disposed at the other end thereof. In FIG. 3, two of the electrode fingers 42a of the input/output electrode 42 are each interposed between adjacent ones of three electrode fingers 43a of the first floating electrode 43. It is noted that the numbers of the electrode fingers 42a and 43a are not particularly limited and can therefore be determined arbitrarily, so long as two electrode fingers 42a are arranged at one end and one electrode finger 43a is disposed at the other end, in accordance with the size of the surface acoustic wave filter 10, the wavelength of SAW, and so forth.

In the second IDT electrode 47, the number of the electrode fingers 45a of the ground electrode 45 is larger by one than the number of the electrode fingers 46a of the second floating electrode 46. Two electrode fingers 45a of the ground electrode 45 are arranged at one end of the second IDT electrode 47 in the direction of SAW propagation. Moreover, one electrode finger 46a of the second floating electrode 46 is disposed at the other end of the second IDT electrode 47. In FIG. 3, two of the electrode fingers 45a of the ground electrode 45 are each interposed between adjacent ones of three electrode fingers 46a of the second floating electrode 46. It is noted that the numbers of the electrode fingers 45a and 46a are not particularly limited and can therefore be determined arbitrarily, so long as two electrode fingers 45a are arranged at one end and one electrode finger 46a is disposed at the other end, in accordance with the size of the surface acoustic wave filter 10, the wavelength of SAW, and so forth.

With the serial IDT 34 and the serial IDT 41 thereby constructed, the signal outputted from the second balance terminal 33 can be reversed in phase to the signal outputted from the first balance terminal 32.

Just like the first embodiment, also in the second embodiment, in the serial IDTs 12 arranged next to each other, the electrode finger 13a of the input/output electrode 13 is adjacent to the electrode finger 16a of the ground electrode 16. Therefore, the current Io that has flowed from one serial IDT 12 to the adjacent serial IDT 12 flows to the ground electrode 16 and thus can hardly flow to the first balance terminal 32. This makes it possible to suppress occurrence of leakage of electric current between the adjacent serial IDTs. Moreover, as in the serial IDTs 12 arranged next to each other, also in the serial IDT 34 and the serial IDT 12 arranged next to each other, the electrode finger 13a of the input/output electrode 13 in the first IDT electrode 15 of the serial IDT 12 is disposed facing the serial IDT 34, and two adjacent electrode fingers 38a of the ground electrode 38 in the second IDT electrode 40 of the serial IDT 34 are arranged facing the serial IDT 12. That is, in the serial IDT 12 and the serial IDT 34 arranged next to each other, the electrode finger 13a of the input/output electrode 13 is adjacent to the two adjacent electrode fingers 38a of the ground electrode 38. Therefore, the current Io that has flowed from the serial IDT 12 to the serial IDT 34 flows to the ground electrode 38 and thus can hardly flow to the second balance terminal 33. This makes it possible to suppress occurrence of leakage of electric current between the adjacent serial IDTs. Further, as in the serial IDTs 12 arranged next to each other, also in the serial IDT 41 and the serial IDT 12 arranged next to each other, the electrode finger 13a of the input/output electrode 13 in the first IDT electrode 15 of the serial IDT 12 is disposed facing the serial IDT 41, and the electrode finger 45a of the ground electrode 45 in the second IDT electrode 47 of the serial IDT 41 is disposed facing the serial IDT 12. That is, in the serial IDT 41 and the serial IDT 12 arranged next to each other, the electrode finger 13a of the input/output electrode 13 is adjacent to the electrode finger 45a of the ground electrode 45. Therefore, the current Io that has flowed from the serial IDT 12 to the serial IDT 41 flows to the ground electrode 45 and thus can hardly flow to the second balance terminal 33. This makes it possible to suppress occurrence of leakage of electric current between the adjacent serial IDTs.

As described heretofore, by suppressing occurrence of leakage of electric current, it is possible to suppress deterioration in out-of-passband attenuation resulting from the leakage current.

Figure 4:
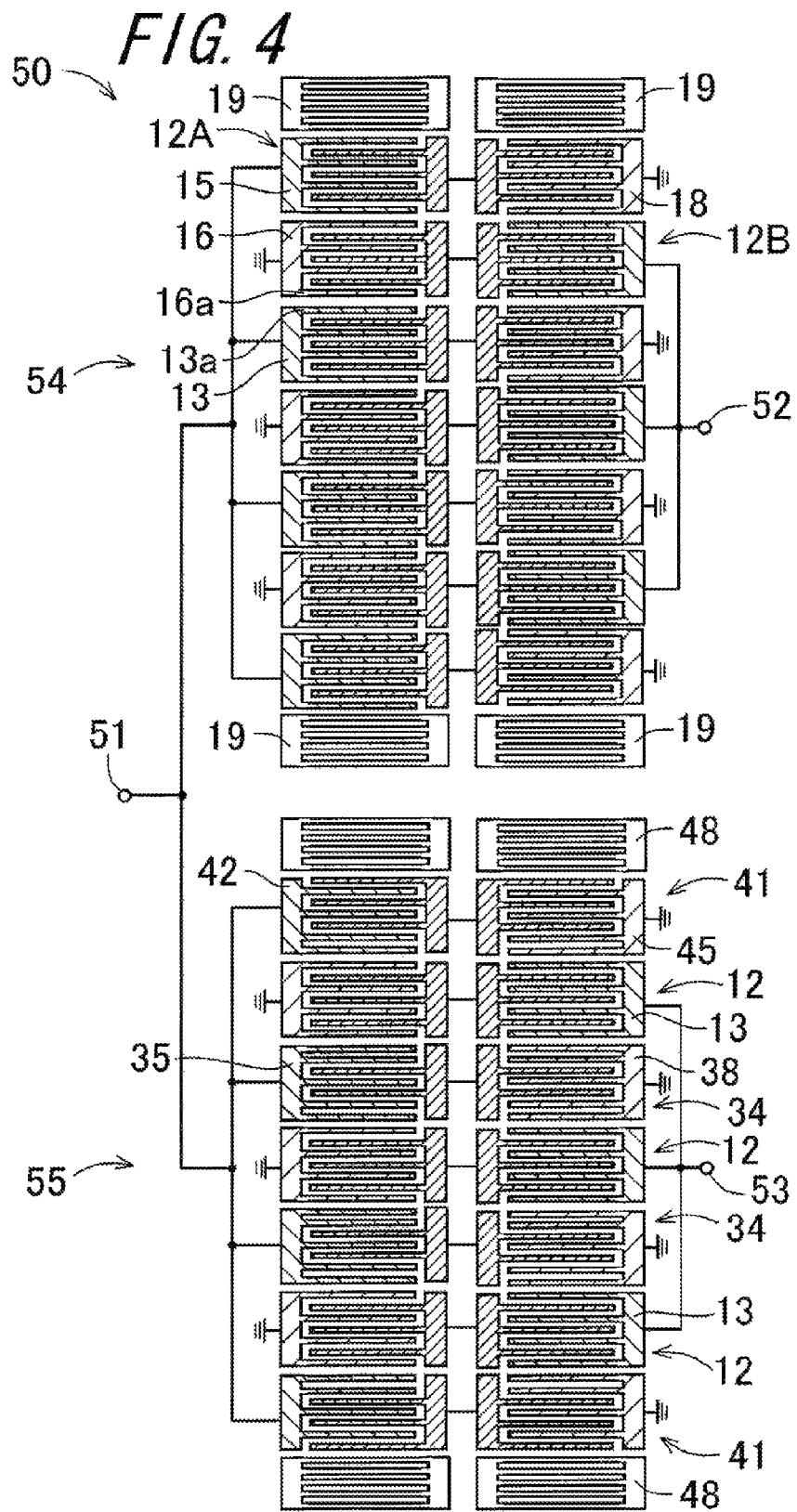
FIG. 4 is a plan view showing a surface acoustic wave filter 50 in accordance with a third embodiment of the invention.

FIG. 4 is a plan view showing a surface acoustic wave filter 50 in accordance with a third embodiment of the invention. The surface acoustic wave filter 50 according to the third embodiment is identical with the second embodiment in that it is of the unbalance input-balance output type which is designed for input of unbalanced signals and output of balanced signals. A signal inputted via an unbalance terminal 51 serving as an input terminal is outputted from a first balance terminal 52, as well as a second balance terminal 53, serving as an output terminal. At this time, the signal outputted from the first balance terminal 52 and the signal outputted from the second balance terminal 53 are in phase opposition; that is, the signals are outputted as differential signals. In this embodiment, the signal outputted from the first balance terminal 52 is in phase with the input signal, and the signal outputted from the second balance terminal 53 is opposite in phase to the signal outputted from the first balance terminal 52.

The surface acoustic wave filter 50 is constructed of an IDT group 54 which receives input of signals via the unbalance terminal 51 and produces output of signals from the first balance terminal 52, and an IDT group 55 which receives input of signals via the unbalance terminal 51 and produces output of signals from the second balance terminal 53.

The IDT group 54 is configured identically to the first embodiment shown in FIG. 1. Moreover, in a serial IDT 12A and a serial IDT 12B arranged next to each other, an electrode finger 13a of an input/output electrode 13 is adjacent to an electrode finger 16a of a ground electrode 16.

The serial IDTs 12A and the serial IDTs 12B are arranged in alternate order in the direction of SAW propagation, and reflectors 19 are disposed on both sides of an array of the serial IDTs in this direction.

The IDT group 55 is configured similarly to the second embodiment shown in FIG. 3. In the IDT group 55, a serial IDT 41 is situated at each of the opposite ends thereof in the direction of SAW propagation, and serial IDTs 12 and serial IDTs 34 are arranged in alternate order between the serial IDTs 41. In addition, reflectors 48 are disposed on an outer side of the IDT group in the direction of SAW propagation. The unbalance terminal 51 is connected with an input/output electrode 35 of the serial IDT 34 and an input/output electrode 42 of the serial IDT 41 as well, and the second balance terminal 53 is connected with the input/output electrode 13 of the serial IDT 12.

In this construction, an output signal from the IDT group 55 is reversed in phase to an output signal from the IDT group 54.

Just like the first and second embodiments, also in the third embodiment, in the serial IDTs 12 arranged next to each other in the IDT group 54, the electrode finger 13*a* of the input/output electrode 13 is adjacent to the electrode finger 16*a* of the ground electrode 16. Therefore, the current Io that has flowed from the serial IDT 12A to the serial IDT 12B flows to the ground electrode 16 and thus can hardly flow to the first balance terminal 52. This makes it possible to suppress occurrence of leakage of electric current between the adjacent serial IDTs. Moreover, also in the serial IDT 34 and the serial IDT 12 arranged next to each other in the IDT group 55, since the electrode finger 13*a* of the input/output electrode 13 is adjacent to the electrode finger 38*a* of the ground electrode 38, it follows that the current Io that has flowed from the serial IDT 12 to the serial IDT 34 flows to the ground electrode 38 and thus can hardly flow to the second balance terminal 53. This makes it possible to suppress occurrence of leakage of electric current between the adjacent serial IDTs. Further, also in the serial IDT 41 and the serial IDT 12 arranged next to each other in the IDT group 55, since the electrode finger 13*a* of the input/output electrode 13 is adjacent to the electrode finger 45*a* of the ground electrode 45, it follows that the current To that has flowed from the serial IDT 12 to the serial IDT 41 flows to the ground electrode 45 and thus can hardly flow to the second balance terminal 53. This makes it possible to suppress occurrence of leakage of electric current between the adjacent serial IDTs.

As described heretofore, by suppressing occurrence of leakage of electric current, it is possible to suppress deterioration in out-of-passband attenuation resulting from the leakage current.

Moreover, in this embodiment, in order to improve the power handling capability even further, the number of the serial IDTs is increased, and the IDT group 54 and the IDT group 55 are connected in parallel to each other.

In the case of using a multiplicity of serial IDTs, the distance of propagation is increased, wherefore SAW coupling cannot be achieved in the intended manner due to variability in wafer processing operation and the influence of transverse mode, with consequent development of ripples within the passband. This leads to an increase in insertion loss. In this respect, by grouping a multiplicity of serial IDTs into two sets: the IDT group 54 and the IDT group 55, and connecting these groups in parallel to each other, it is possible to shorten the distance of SAW propagation and thereby achieve SAW coupling satisfactorily. In this way, the development of ripples within the passband can be suppressed.

Figure 5:
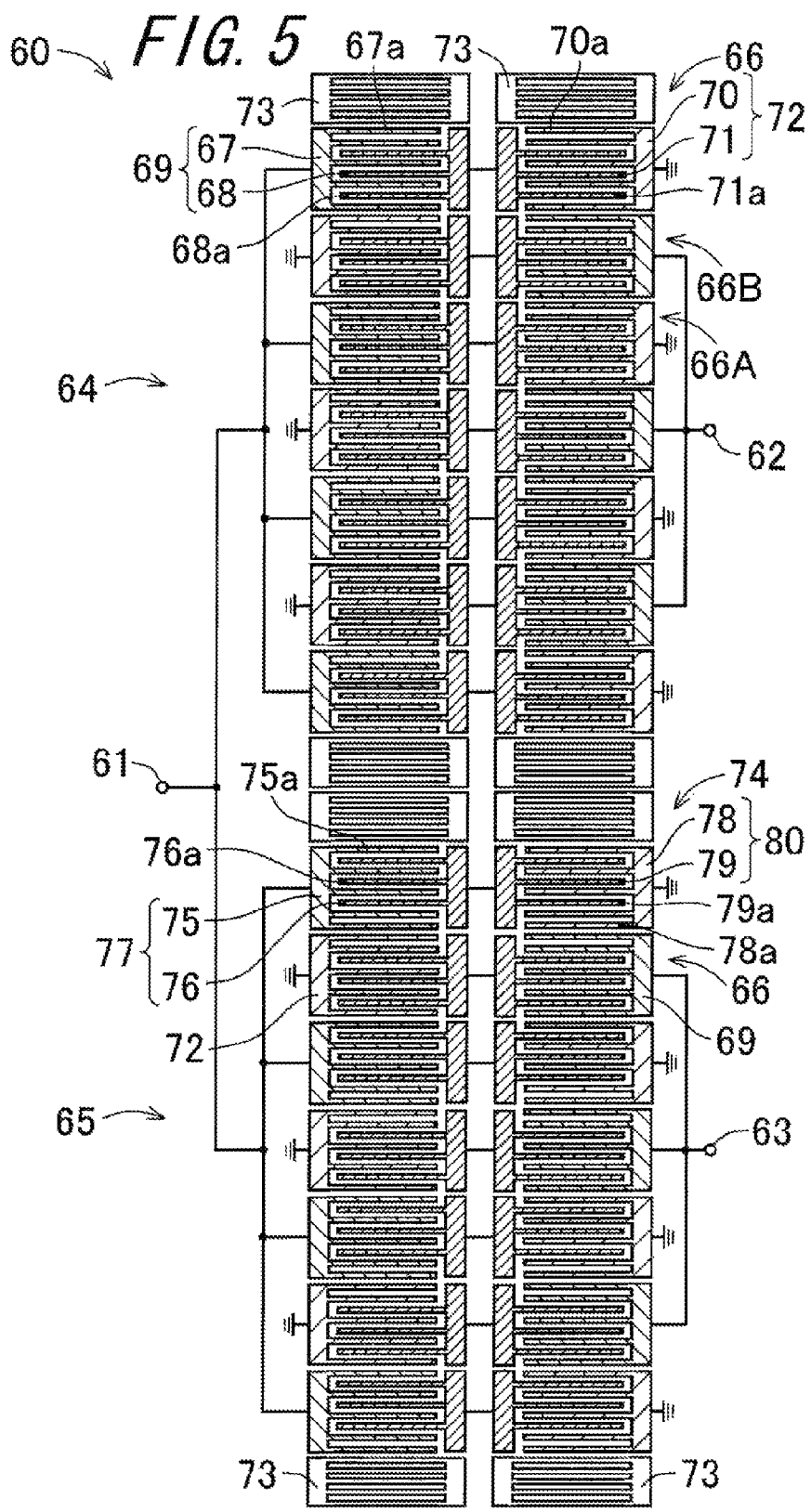
FIG. 5 is a plan view showing a surface acoustic wave filter 60 in accordance with a fourth embodiment of the invention.

FIG. 5 is a plan view showing a surface acoustic wave filter 60 in accordance with a fourth embodiment of the invention. The surface acoustic wave filter 60 according to the fourth embodiment is identical with the second and third embodiments in that it is of the unbalance input-balance output type which is designed for input of unbalanced signals and output of balanced signals. A signal inputted via an unbalance terminal 61 serving as an input terminal is outputted from a first balance terminal 62, as well as a second balance terminal 63, serving as an output terminal. At this time, the signal outputted from the first balance terminal 62 and the signal outputted from the second balance terminal 63 are in phase opposition; that is, the signals are outputted as differential signals. In this embodiment, the signal outputted from the first balance terminal 62 is in phase with the input signal, and the signal outputted from the second balance terminal 63 is opposite in phase to the signal outputted from the first balance terminal 62.

The surface acoustic wave filter 60 is constructed of an IDT group 64 which receives input of signals via the unbalance terminal 61 and produces output of signals from the first balance terminal 62, and an IDT group 65 which receives input of signals via the unbalance terminal 61 and produces output of signals from the second balance terminal 63.

The IDT group 64 includes a plurality of serial IDTs 66. The serial IDT 66 is constructed of a first IDT electrode 69 composed of an input/output electrode 67 and a first floating electrode 68 and a second IDT electrode 72 composed of a ground electrode 70 and a second floating electrode 71, the first IDT electrode 69 and the second IDT electrode 72 being connected in series to each other via the first floating electrode 68 and the second floating electrode 71.

The input/output electrode 67 and the first floating electrode 68, each of which is a comb-shaped electrode formed of a strip-like common electrode and a plurality of electrode fingers extending perpendicularly to the common electrode, are arranged facing each other in such a manner that their common electrodes become parallel and that, within the region of confrontation between the common electrodes, the electrode fingers of the comb-shaped electrodes are alternately arranged in an interdigital fashion in the direction of SAW propagation.

Likewise, the ground electrode 70 and the second floating electrode 71, each of which is a comb-shaped electrode formed of a strip-like common electrode and a plurality of electrode fingers extending perpendicularly to the common electrode, are arranged facing each other in such a manner that their common electrodes become parallel and that, within the region of confrontation between the common electrodes, the electrode fingers of the comb-shaped electrodes are alternately arranged in an interdigital fashion in the direction of SAW propagation.

In the first IDT electrode 69, the number of the electrode fingers 67*a* of the input/output electrode 67 is larger by two than the number of the electrode fingers 68*a* of the first floating electrode 68, and the electrode finger at each of the opposite ends of the first IDT electrode 69 corresponds to the electrode finger 67*a* of the input/output electrode 67. Moreover, two electrode fingers 67*a* are arranged at one end of the first IDT electrode 69, and one electrode finger 67*a* is disposed at the other end thereof in the direction of SAW propagation. In FIG. 5, the input/output electrode 67 has five electrode fingers 67*a* in total, and two of them are situated at one end, one of them is situated at the other end, and the remaining two electrode fingers are situated between the two at one end and the one at the other end. Three electrode fingers 68*a* of the first floating electrode 68 are each interposed between adjacent ones of the five electrode fingers 67*a*. It is noted that the numbers of the electrode fingers 67*a* and 68*a* are not particularly limited and can therefore be determined arbitrarily, so long as two electrode fingers 67*a* are arranged at one end and one electrode finger 67*a* is disposed at the other end, in accordance with the size of the surface acoustic wave filter 60, the wavelength of SAW, and so forth.

In the second IDT electrode 72, the number of the electrode fingers 70*a* of the ground electrode 70 is larger by two than the number of the electrode fingers 71*a* of the second floating electrode 71, and the electrode finger at each of the opposite ends of the second IDT electrode 72 corresponds to the electrode finger 70*a* of the ground electrode 70. The numbers of the electrode fingers 70*a* and 71*a* are not particularly limited and can therefore be determined arbitrarily, so long as two electrode fingers 70*a* are arranged at one end and one electrode finger 70*a* is disposed at the other end, in accordance with the size of the surface acoustic wave filter 60, the wavelength of SAW, and so forth.

Among a plurality of serial IDTs 66, out of the serial IDTs 66 arranged next to each other, one will be referred to as "the serial IDT 66A" and the other will be referred to as "the serial IDT 66B".

The first IDT electrode 69 is so configured that the electrode finger at each end thereof in the SAW propagation direction corresponds to the electrode finger 67a of the input/output electrode 67, and the second IDT electrode 72 is so configured that the electrode finger at each end thereof in the SAW propagation direction corresponds to the electrode finger 70a of the ground electrode 70. That is, the electrode finger 67a of the input/output electrode 67 in the first IDT electrode 69 of the serial IDT 66A is disposed facing the serial IDT 66B, and the electrode finger 70a of the ground electrode 70 in the second IDT electrode 72 of the serial IDT 66B is disposed facing the serial IDT 66A. Accordingly, in the serial IDT 66A and the serial IDT 66B arranged next to each other, the electrode finger 67a of the input/output electrode 67 is adjacent to the electrode finger 70a of the ground electrode 70.

The serial IDTs 66A and the serial IDTs 66B which have an inverse relationship therebetween in terms of electrode arrangement are arranged in alternate order in the longitudinal direction X which is also the direction of SAW propagation, and a reflector 73 is disposed on both sides of an array of the serial IDTs in this direction, A surface acoustic wave excited for propagation by the serial IDT 66A and the serial IDT 66B is reflected from the reflector 73, thereby producing a standing wave.

The IDT group 65 is composed of a plurality of serial IDTs 66 and a plurality of serial IDTs 74. The serial IDT 74 is similar in configuration to the serial IDT 66 and thus has a first IDT electrode 77 composed of an input/output electrode 75 and a first floating electrode 76 and a second IDT electrode 80 composed of a ground electrode 78 and a second floating electrode 79, the first IDT electrode 77 and the second IDT electrode 80 being connected in series to each other via the first floating electrode 76 and the second floating electrode 79.

The input/output electrode 75 and the first floating electrode 76, each of which is a comb-shaped electrode formed of a strip-like common electrode and a plurality of electrode fingers extending perpendicularly to the common electrode, are arranged facing each other in such a manner that their common electrodes become parallel and that, within the region of confrontation between the common electrodes, the electrode fingers of the comb-shaped electrodes are alternately arranged in an interdigital fashion in the direction of SAW propagation.

Likewise, the ground electrode 78 and the second floating electrode 79, each of which is a comb-shaped electrode formed of a strip-like common electrode and a plurality of electrode fingers extending perpendicularly to the common electrode, are arranged facing each other in such a manner that their common electrodes become parallel and that, within the region of confrontation between the common electrodes, the electrode fingers of the comb-shaped electrodes are alternately arranged in an interdigital fashion in the direction of SAW propagation.

In the first IDT electrode 77, the number of the electrode fingers 75a of the input/output electrode 75 is larger by two than the number of the electrode fingers 75a of the first floating electrode 76, and the electrode finger at each of the opposite ends of the first IDT electrode 77 corresponds to the electrode finger 75a of the input/output electrode 75. The numbers of the electrode fingers 75a and 76a are not particularly limited and can therefore be determined arbitrarily, so long as one electrode finger 75a is disposed at one end and two electrode fingers 75a are arranged at the other end, in accordance with the size of the surface acoustic wave filter 60, the wavelength of SAW, and so forth.

In the second IDT electrode 80, the number of the electrode fingers 78a of the ground electrode 78 is larger by two than the number of the electrode fingers 79a of the second floating electrode 79, and the electrode finger at each of the opposite ends of the second IDT electrode 80 corresponds to the electrode finger 78a of the ground electrode 78. The numbers of the electrode fingers 78a and 79a are not particularly limited and can therefore be determined arbitrarily, so long as one electrode finger 78a is disposed at one end and two electrode fingers 79a are arranged at the other end, in accordance with the size of the surface acoustic wave filter 60, the wavelength of SAW, and so forth.

In the serial IDT 74, the first IDT electrode 77 is so configured that the electrode finger at each end thereof in the SAW propagation direction corresponds to the electrode finger 75a of the input/output electrode 75. In the serial IDT 66, the second IDT electrode 72 is so configured that the electrode finger at each end thereof in the SAW propagation direction corresponds to the electrode finger 70a of the ground electrode 70. That is, two adjacent electrode fingers 75a of the input/output electrode 75 in the first IDT electrode 77 of the serial IDT 74 are arranged facing the serial IDT 66, and two adjacent electrode fingers 70a of the ground electrode 70 in the second IDT electrode 72 of the serial IDT 66 are arranged facing the serial IDT 74. Accordingly, in the serial IDT 74 and the serial IDT 66 arranged next to each other, the two adjacent electrode fingers 75a of the input/output electrode 75 are adjacent to the two adjacent electrode fingers 70a of the ground electrode 70.

Just like the first to third embodiments, also in the fourth embodiment, in the serial IDT 66A and the serial IDT 66B arranged next to each other, the electrode finger 67a of the input/output electrode 67 is adjacent to the electrode finger 70a of the ground electrode 70. Therefore, the current Io that has flowed from the serial IDT 66A to the serial IDT 66B flows to the ground electrode 70 and thus can hardly flow to the first balance terminal 62. This makes it possible to suppress occurrence of leakage of electric current between the adjacent serial IDTs. Moreover, as in the serial IDT 66A and the serial IDT 66B arranged next to each other, also in the serial IDT 66 and the serial IDT 74 arranged next to each other, since two electrode fingers 75a of the input/output electrode 75 are adjacent to two electrode fingers 70a of the ground electrode 70, it follows that the current Io that has flowed from the serial IDT 74 to the serial IDT 66 flows to the ground electrode 70 and thus can hardly flow to the second balance terminal 63. This makes it possible to suppress occurrence of leakage of electric current between the adjacent serial IDTs.

As described heretofore, by suppressing occurrence of leakage of electric current, it is possible to suppress deterioration in out-of-passband attenuation resulting from the leakage current.

Moreover, in this embodiment, in order to improve the power handling capability even further, the number of the serial IDTs is increased, and also the IDT group 64 and the IDT group 65 are connected in parallel to each other. By connecting the IDT group 64 and the IDT group 65 in parallel to each other, it is possible to shorten the distance of SAW propagation and thereby achieve SAW coupling satisfactorily.

Figure 6:
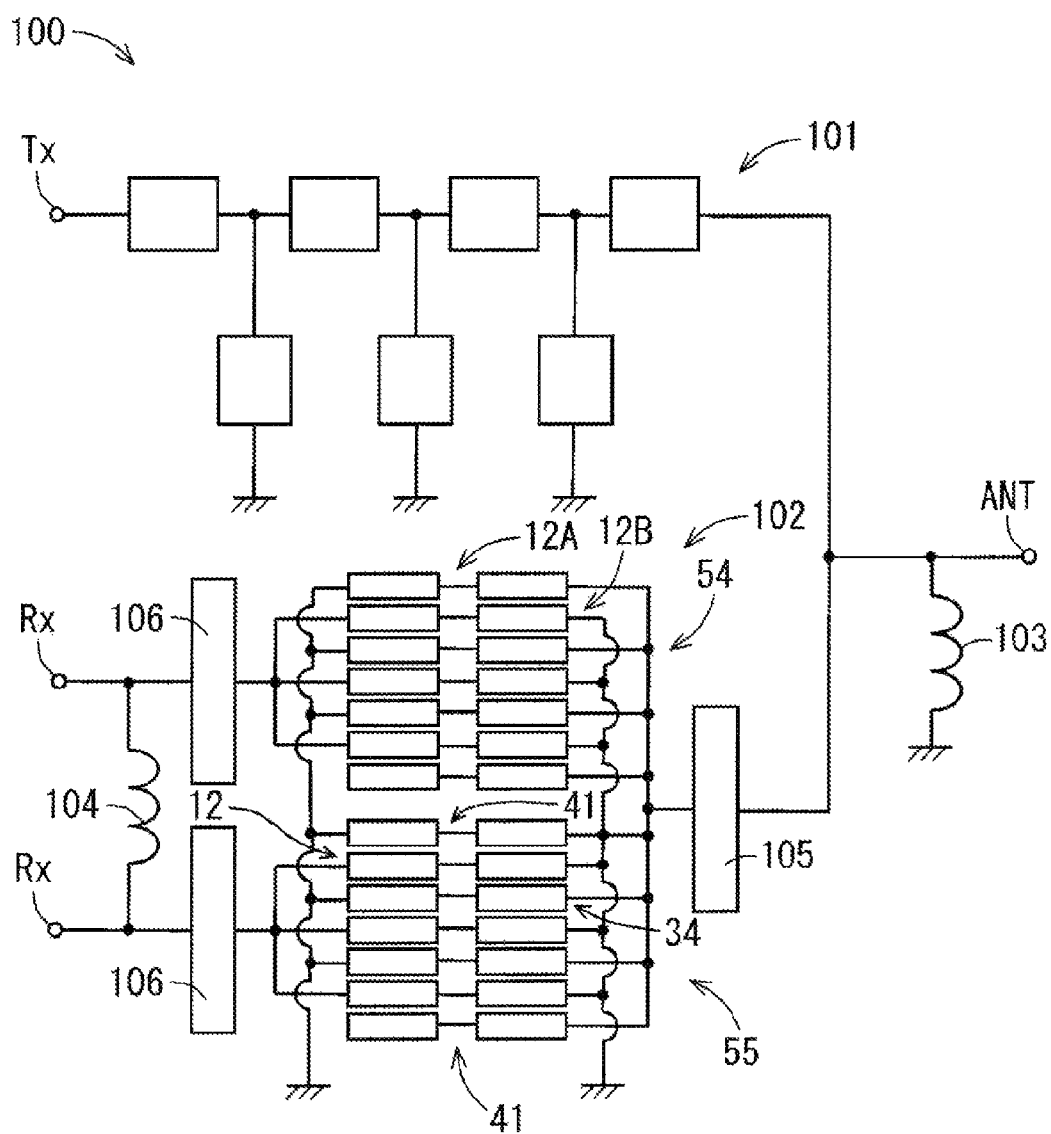
FIG. 6 is a schematic diagram showing the configuration of a duplexer 100 in accordance with a fifth embodiment of the invention.

FIG. 6 is a schematic diagram showing the configuration of a duplexer 100 in accordance with a fifth embodiment of the invention. The duplexer 100 includes a transmission filter 101 and a reception filter 102. The transmission filter 101 is realized by the use of a ladder-type surface acoustic wave filter having high power handling capability. The reception filter 102 is realized by the use of the surface acoustic wave filter according to the first to fourth embodiments. In this embodiment, the surface acoustic wave filter 50 according to the third embodiment is used for the reception filter 102.

An antenna terminal ANT is connected to the transmission filter 101 and the reception filter 102. A transmitting-side terminal Tx is connected to a side of the transmission filter 101 opposite the side thereof facing an antenna. A receiving-side terminal Rx is connected to a side of the reception filter 102 opposite the side thereof facing the antenna. A transmission signal inputted from a signal source connected to the duplexer 100 passes through the transmission filter 101, and a signal in a predetermined frequency band is outputted to the antenna. A reception signal received by the antenna passes through the reception filter 102, and a signal in a predetermined frequency band is outputted.

Between the antenna terminal ANT and a branch of the transmission filter 101 and the reception filter 102 is connected an inductor as a matching circuit 103. Moreover, across two output wiring lines of the reception filter 102 is connected an inductor as a matching circuit 104. In order to increase the resistance to electrostatic breakdown, a resonator 105 may be connected in series to the input side of the reception filter 102, and also a resonator 106 may be connected in series to the output side thereof.

Like the surface acoustic wave filter 50, the reception filter 102 includes an IDT group 54 and an IDT group 55. In the IDT group 54, a serial IDT 12A and a serial IDT 12B are arranged next to each other. In the IDT group 55, a serial IDT 41 is disposed at each of the opposite ends thereof, and serial IDTs 12 and serial IDTs 34 are arranged in alternate order between the serial IDTs 41. In the reception filter 102, by suppressing occurrence of leakage of electric current in the manner described previously, it is possible to suppress deterioration in out-of-passband attenuation resulting from the leakage current, and thereby enhance the electric characteristics of the duplexer 100.

Now, a method of manufacturing the surface acoustic wave filter 10 will be explained below. To begin with, the piezoelectric substrate 11 is subjected to ultrasonic cleaning with use of acetone, isopropyl alcohol, or the like to remove organic components. Then, the substrate is thoroughly dried in a clean oven, whereafter a laminate electrode is formed on one main surface of the piezoelectric substrate 11 in the Z direction by means of sputtering. The laminate electrode is composed of a titanium (Ti) thin layer and a thin layer of an alloy made of copper (Cu)-containing aluminum (Al). More specifically, the laminate electrode is formed by stacking three titanium (Ti) thin layers and three alloy thin layers of copper (Cu)-containing aluminum (Al) alternately in order, from the side of the main surface of the piezoelectric substrate 11. For example, a 38.7° Y-cut and X-direction propagation substrate made of lithium tantalate single crystal can be used as the piezoelectric substrate 11. Alternatively, lithium tetraborate or lithium niobate may be used for the piezoelectric substrate 11.

Next, a resist is applied thereon, and the resist is patterned into a desired shape by a reduced projection exposure apparatus (stepper). In a developing device, unnecessary part of the resist is dissolved in alkaline developing solution, thereby forming a desired resist pattern. Then, electrode etching is performed in a Reactive Ion Etching (RIE for short) apparatus, with the resist pattern used as an etching mask. Following the completion of the electrode etching, the resist is removed, whereupon electrode patterning is finished. Each of the serial IDTs 12 and the reflector 19 are formed through the process steps thus far described.

Next, a protective film made of silica ($SiO_2$) is formed on the main surface of the piezoelectric substrate 11 by a thermal chemical vapor deposition (Thermal CVD for short) apparatus. After the formation of the protective film, a resist is applied thereon once again. Then, in order to form a pad for the input terminal 21 and a pad for the output terminal 23, corresponding part of the resist is removed by means of light exposure.

Next, in order to form an electrode constituting an input/output pad, corresponding part of the $SiO_2$-made protective film is removed by means of reactive ion etching (RIE).

Next, chromium (Cr), nickel (Ni), and gold (Au) are coated thereon one after another in the order named by means of sputtering to form a conductor film constituting an input/output pad. The conductor film is provided to establish electrical and structural connection between the surface acoustic wave filter 10 and a circuit board on which is mounted the surface acoustic wave filter 10 with high reliability. In the case of using solder for the connection between the surface acoustic wave filter 10 and the circuit board, the conductor film performs the functions of ensuring wettability to solder and preventing solder diffusion. Moreover, in the case of using gold bump for the connection between the surface acoustic wave filter 10 and the circuit board, each pad electrode is formed by coating chromium (Cr) and aluminum (Al) successively in the order named. When the gold bump is used for the connection between the surface acoustic wave filter 10 and the circuit board, the conductor film performs the function of controlling the hardness of a pad in such a manner as to permit bonding of the gold bump by means of ultrasound or otherwise.

Next, in addition to the resist, unnecessary part of the conductor film is removed by a lift-off technique to form an input/output pad electrode. Then, the piezoelectric substrate 11 is divided into pieces on a surface acoustic wave filter 10-by-surface acoustic wave filter 10 basis by a dicing technique using a dicing blade or a laser cutting technique based on laser processing, thereby obtaining a plurality of surface acoustic wave filters 10. The thereby obtained surface acoustic wave filters 10 are mounted on the circuit board in a face-down fashion. The circuit board is realized by the use of, for example, a low temperature co-fired ceramics (LTCC for short) substrate.

Next, the duplexer 100 according to the fifth embodiment was modeled, and the transmission characteristics of the reception filter 102 of the model was evaluated by running a simulation.

EXAMPLE

The surface acoustic wave filter as shown in FIG. 1 was modeled under the following conditions.

Aluminum was used as an electrode material, and coating thickness was set at 1600 Å. The crossing width for electrode fingers was set at 45 μm, and the ratio of electrodes (duty) was set at 0.62.

The number of electrodes for each reflector was 50, and the numbers of electrodes for the serial IDTs arranged end to end in the IDT group 54 as well as the IDT group 55 were 29, 47, 41, 47, 41, 47, and 29, respectively. The pitch of electrodes in the reflector was 0.947 μm, and the pitch of electrodes in the serial IDT was 0.831 to 0.971 μm.

Moreover, the terminal impedance on the input side and the terminal impedance on the output side were each set at 50 Ω.

In the Example, adjacent serial IDTs were so arranged that an electrode finger of the input/output electrode was adjacent to an electrode finger of the ground electrode.

COMPARATIVE EXAMPLE

Comparative Example was constructed similarly to the Example, but the Comparative Example differs from the Example in that adjacent serial IDTs were so arranged that an electrode finger of the floating electrode was adjacent to an electrode finger of the input/output electrode, and an electrode finger of the floating electrode was adjacent to an electrode finger of the ground electrode.

Figure 7:
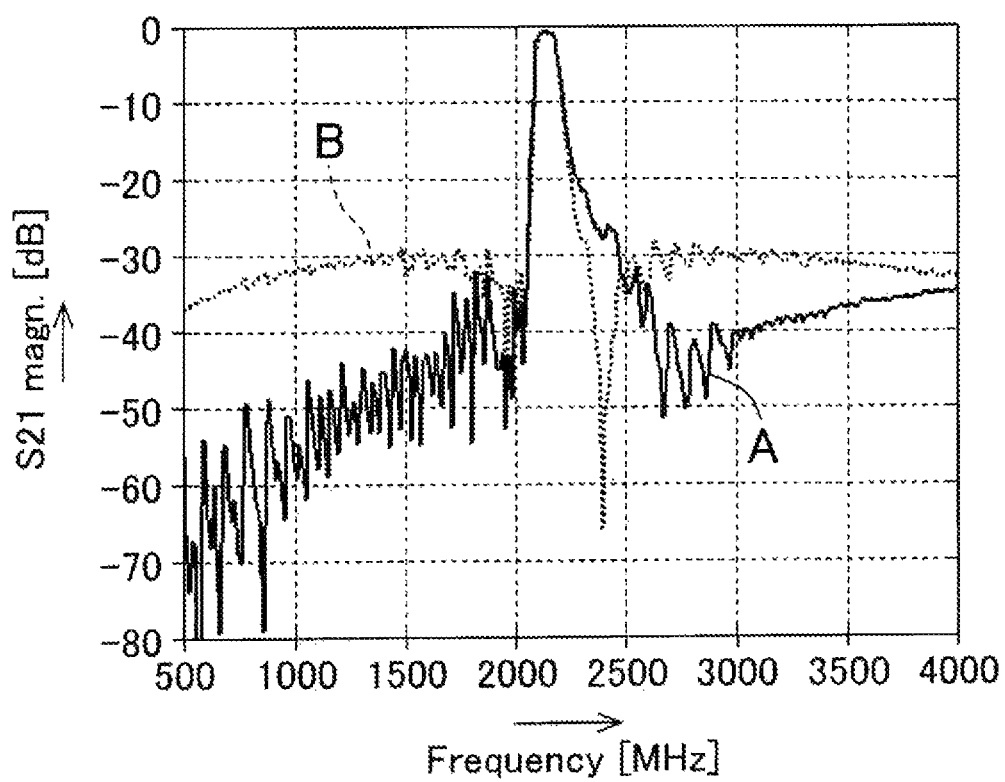
FIG. 7 is a graph showing the results of simulation conducted on Example and Comparative Example.

FIG. 7 is a graph showing the results of simulation conducted on the Example and the Comparative Example. The abscissa axis represents frequency (MHz) and the ordinate axis represents S parameter S21 (dB) indicative of transmission characteristics.

In the plot, a graph A indicates the simulation result as to the Example, whereas a graph B indicates the simulation result as to the Comparative Example.

As will be understood from the graphs, within the passband, both of the Example and the Comparative Example exhibited similar S21-characteristics. However, in the region outside the passband, the Comparative Example failed to achieve an adequate reduction in the level of S21-characteristics, with a consequent deterioration in attenuation due to leakage current. By contrast, in the Example, the level of S21-characteristics has been reduced satisfactorily in the region outside the passband. That is, the Example succeeded in suppressing deterioration in attenuation.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

REFERENCE SIGNS LIST 10, 30, 50, 60: Surface acoustic wave filter
11: Piezoelectric substrate
12, 34, 41, 66, 74: Serial IDT
13, 35, 42, 67, 75: Input/output electrode
14, 36, 43, 68, 76: First floating electrode
16, 38, 45, 70, 78: Ground electrode
17, 39, 46, 71, 79: Second floating electrode
100: Duplexer
101: Transmission filter
102: Reception filter

The invention claimed is:

1. A surface acoustic wave filter, comprising:
a plurality of series-connected type IDT electrodes each comprising
a first IDT electrode which comprises an input/output electrode comprising a plurality of first electrode fingers, and a first floating electrode with a floating state electrically comprising a plurality of second electrode fingers, and
a second IDT electrode which comprises a ground electrode comprising a plurality of third electrode fingers, and a second floating electrode with a floating state electrically comprising a plurality of fourth electrode fingers and being connected to the first floating electrode, wherein the plurality of series-connected type IDT electrodes comprises a first series-connected type IDT electrode and a second series-connected type IDT electrode which is adjacent to the first series-connected type IDT electrode, the first IDT electrode of the first series-connected type IDT electrode and the second IDT electrode of the second series-connected type IDT electrode being located next to each other, at least one of the plurality of first electrode fingers of the first series-connected type IDT electrode is located facing the second series-connected type IDT electrode, at least one of the plurality of third electrode fingers of the first series-connected type IDT electrode is located facing the second series-connected type IDT electrode, at least one of the plurality of first electrode fingers of the second series-connected type IDT electrode is located facing the first series-connected type IDT electrode, and at least one of the plurality of third electrode fingers of the second series-connected type IDT electrode is located facing the first series-connected type IDT electrode.

2. The surface acoustic wave filter according to claim 1, wherein one of the plurality of second electrode fingers is interposed between two of the plurality of first electrode fingers that are arranged next to each other, and one of the plurality of fourth electrode fingers is interposed between two of the plurality of third electrode fingers that are arranged next to each other.

3. The surface acoustic wave filter according to claim 1, further comprising:
a first external terminal which is connected to the input/output electrode of the first series-connected type IDT electrode, and is configured to receive input of an unbalanced signal or produce output of an unbalanced signal; and
a second external terminal which is connected to the input/output electrode of the second series-connected type IDT electrode, and is configured to produce output of an unbalanced signal or receive input of an unbalanced signal.

4. The surface acoustic wave filter according to claim 1, further comprising:
a first external terminal which is connected to the input/output electrode of the first series-connected type IDT electrode, and is configured to receive input of a balanced signal or produce output of a balanced signal; and
a second external terminal which is connected to the input/output electrode of the second series-connected type IDT electrode, and is configured to produce output of an unbalanced signal or receive input of an unbalanced signal.

5. The surface acoustic wave filter according to claim 1, further comprising:
a first common electrode connected to each of the plurality of first electrode fingers;
a second common electrode connected to each of the plurality of second electrode fingers;
a third common electrode connected to each of the plurality of third electrode fingers; and
a fourth common electrode connected to each of the plurality of fourth electrode fingers.

6. The surface acoustic wave filter according to claim 5, wherein, out of the plurality of third electrode fingers of the second series-connected type IDT electrode, the at least one of the plurality of third electrode fingers located facing the first series-connected type IDT electrode is located between the second common electrode of the first series-connected type IDT electrode and the fourth common electrode of the second series-connected type IDT electrode.

7. A duplexer comprising:
   a transmission filter; and
   a reception filter,
   wherein at least one of the transmission filter and the reception filter is the surface acoustic wave filter according to claim 1.

8. The surface acoustic wave filter according to claim 1, further comprising:
   reflectors being located both sides of an array of the plurality of series-connected type IDT electrodes which are arranged next to each other, in a direction along a propagation direction of a surface acoustic wave so that the array of the plurality of series-connected type IDT electrodes is sandwiched therebetween.

* * * * *